(12) United States Patent
Lee et al.

(10) Patent No.: US 10,461,192 B2
(45) Date of Patent: Oct. 29, 2019

(54) METAL OXIDE PROTECTION STRUCTURE OF A SEMICONDUCTOR DEVICE

(71) Applicant: Samsung Display Co., Ltd., Yongin-si (KR)

(72) Inventors: Je-Hun Lee, Seoul (KR); Eun-Hyun Kim, Suwon-si (KR); Sang-Won Shin, Yongin-si (KR); Eun-Young Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/842,540

(22) Filed: Sep. 1, 2015

(65) Prior Publication Data

US 2016/0118503 A1 Apr. 28, 2016

(30) Foreign Application Priority Data

Oct. 22, 2014 (KR) .................. 10-2014-0143178

(51) Int. Cl.
*H01L 29/786* (2006.01)
*H01L 29/66* (2006.01)
*H01L 27/12* (2006.01)
*H01L 21/02* (2006.01)
(Continued)

(52) U.S. Cl.
CPC .. *H01L 29/78606* (2013.01); *H01L 21/02244* (2013.01); *H01L 21/02255* (2013.01); *H01L 21/443* (2013.01); *H01L 27/1248* (2013.01); *H01L 29/42384* (2013.01); *H01L 29/66969* (2013.01); *H01L 29/7869* (2013.01)

(58) Field of Classification Search
CPC ............... H01L 29/786; H01L 29/7869; H01L 51/0545; H01L 29/42388; H01L 29/42384; H01L 21/02244; H01L 21/02255; H01L 27/1248; H01L 29/78606
See application file for complete search history.

(56) References Cited

U.S. PATENT DOCUMENTS 7,382,421 B2 6/2008 Hoffman et al.
2010/0283049 A1 11/2010 Sato et al.
(Continued)

FOREIGN PATENT DOCUMENTS

KR 10-0857455 9/2008
KR 10-2014-0043554 4/2014
KR 10-2014-0049934 4/2014

OTHER PUBLICATIONS

Extended European Search Report, dated Mar. 16, 2016, in European Patent Application No. 15190735.6.

*Primary Examiner* — Davienne N Monbleau
*Assistant Examiner* — Leslie Pilar Cruz
(74) *Attorney, Agent, or Firm* — H.C. Park & Associates, PLC

(57) ABSTRACT

A semiconductor device may include a substrate, a gate electrode disposed on the substrate, a gate insulation layer disposed on the substrate to cover the gate electrode, an active layer including an oxide semiconductor disposed on the gate insulation layer, an insulating interlayer disposed on the gate insulation layer to cover the active layer, a protection structure including a plurality of metal oxide layers disposed on the insulating interlayer, and a source electrode and a drain electrode disposed on the protection structure.

9 Claims, 8 Drawing Sheets

(51) Int. Cl.
*H01L 21/443* (2006.01)
*H01L 29/423* (2006.01)

(56) References Cited

U.S. PATENT DOCUMENTS

| | | | |
|---|---|---|---|
| 2011/0263091 A1* | 10/2011 | Yamazaki | H01L 27/1225 438/287 |
| 2013/0161610 A1* | 6/2013 | Yamazaki | H01L 29/7869 257/43 |
| 2013/0341614 A1* | 12/2013 | Chung | H01L 27/1225 257/40 |
| 2014/0084283 A1 | 3/2014 | Lim et al. | |
| 2014/0106502 A1 | 4/2014 | Tezuka et al. | |
| 2014/0110705 A1 | 4/2014 | Koezuka et al. | |
| 2014/0175432 A1 | 6/2014 | Yamazaki et al. | |
| 2015/0102341 A1* | 4/2015 | Yamazaki | H01L 29/7869 257/43 |

* cited by examiner

METAL OXIDE PROTECTION STRUCTURE OF A SEMICONDUCTOR DEVICE

CROSS-REFERENCE TO RELATED APPLICATION

This application claims priority from and the benefit of Korean patent Application No. 10-2014-0143178, filed on Oct. 22, 2014, which is hereby incorporated by reference for all purposes as if fully set forth herein.

BACKGROUND

Field

Exemplary embodiments of the invention relate to semiconductor devices and methods of manufacturing semiconductor devices. More particularly, exemplary embodiments of the invention relate to oxide semiconductor devices including protection structures, and methods of manufacturing the oxide semiconductor devices including the protection structures.

Discussion of the Background

A conventional tin film transistor ("TFT") having a bottom gate configuration generally includes a gate electrode disposed on a substrate, a gate insulation layer disposed on the gate insulation layer, a source electrode and a drain electrode disposed on the gate insulation layer, and an active layer among the gate insulation layer, the source electrode, and the drain electrode. The source electrode and the drain electrode may make contact with a source region and a drain region of the active layer.

In the formation of the conventional transistor having a bottom gate configuration, moisture and/or hydrogen may be permeated into the structures of the transistor such that the electrical characteristics of the transistor may be easily degraded. For example, variation of the threshold voltage (Vth) of the transistor may be caused by moisture and/or hydrogen, so that the transistor may have degraded electrical characteristics, such as an increase of the threshold voltage distribution, a decrease of the driving current, etc. In particular, the conventional oxide semiconductor device, which includes an active layer of oxide semiconductor, may be relatively sensitive to moisture and/or hydrogen, and thus, the electrical characteristics of the oxide semiconductor device may be easily degraded. Such a degraded oxide semiconductor device may not be properly employed in recent display devices, such as liquid crystal display devices, organic light emitting display devices, etc.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide oxide semiconductor devices having improved electrical characteristics by preventing permeation of moisture and/or hydrogen.

Exemplary embodiments also provide methods of manufacturing oxide semiconductor devices having improved electrical characteristics by prevention permeation of moisture and/or hydrogen.

Additional aspects will be set forth in the detailed description which follows, and, in part, will be apparent from the disclosure, or may be learned by practice of the inventive concept.

An exemplary embodiment of the present invention discloses a semiconductor device including: a gate electrode disposed on a substrate, a gate insulation layer disposed on the substrate to cover the gate electrode, an active layer including an oxide semiconductor disposed on the gate insulation layer, an insulating interlayer disposed on the gate insulation layer and covering the active layer, a protection structure disposed on the insulating interlayer, and a source electrode and a drain electrode disposed on the protection structure. The protection structure may include a plurality of metal oxide layers. The source electrode and the drain electrode may contact a source region and a drain region of the active layer, respectively.

An exemplary embodiment of the present invention also discloses a semiconductor device including: a gate electrode disposed on a substrate, a gate insulation layer disposed on the substrate and covering the gate electrode, an active layer disposed on the gate insulation layer, the active layer including an oxide semiconductor, a first insulating interlayer disposed on the gate insulation layer and covering the active layer, a source electrode and a drain electrode disposed on the first insulating interlayer, a second insulating interlayer disposed on the first insulating interlayer, the source electrode and the drain electrode, and a protection structure disposed on the second insulating interlayer. The protection structure may include a plurality of metal oxide layers. The source electrode and the drain electrode may contact a source region and a drain region of the active layer, respectively.

An exemplary embodiment of the present invention also discloses a method of manufacturing a semiconductor device. In the method of manufacturing the semiconductor device, a gate electrode may be formed on a substrate, and a gate insulation layer may be formed on the substrate to cover the gate electrode. After forming an active layer including an oxide semiconductor on the gate insulation layer, an insulating interlayer may be formed on the active layer to substantially cover the gate insulation layer. A protection structure including a plurality of metal oxide layers may be formed on the insulating interlayer. A source electrode and a drain electrode may be formed on the protection structure. The source electrode and the drain electrode may contact a source region and a drain region of the active layer, respectively.

An exemplary embodiment of the present invention also discloses a method of manufacturing a semiconductor device. In the method of manufacturing the semiconductor device, a gate electrode may be formed on a substrate. A gate insulation layer may be formed on the substrate to substantially cover the gate electrode. An active layer including an oxide semiconductor may be formed on the gate insulation layer, and then a first insulating interlayer may be formed on the active layer to substantially cover the gate insulation layer. A source electrode and a drain electrode may be formed on the first insulating interlayer. The source electrode and the drain electrode may contact a source region and a drain region of the active layer, respectively. A second first insulating interlayer may be formed on the first insulating interlayer, the source electrode and the drain electrode, and then a protection structure including a plurality of metal oxide layers may be formed on the second insulating interlayer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
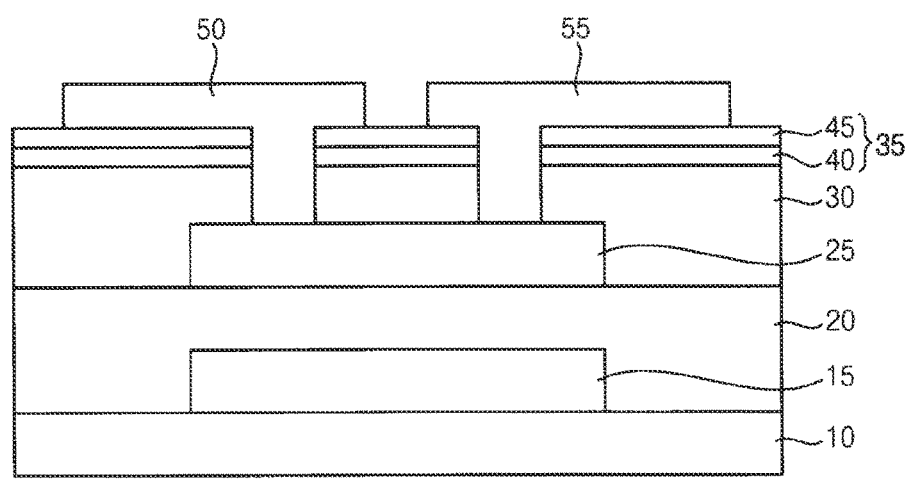
FIG. 1 is a cross-sectional view illustrating an oxide semiconductor device in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating an oxide semiconductor device in accordance with an exemplary embodiment.

Referring to FIG. 1, a semiconductor device may include a gate electrode 15, a gate insulation layer 20, an active layer 25, an insulating interlayer 30, a protection structure 35, a source electrode 50, and a drain electrode 55, which may be sequentially disposed on a substrate 10. The protection structure 35 may include a plurality of metal oxide layers. For example, the protection structure 35 may include a first metal oxide layer 40 and a second metal oxide layer 45. Here, each of the first metal oxide layer 40 and the second metal oxide layer 45 may include aluminum oxide ($AlO_x$), titanium oxide ($TiO_x$), tantalum oxide ($TaO_x$), zirconium oxide ($ZrO_x$), etc.

The substrate 10 may include an insulation material. For example, the substrate 10 may include a glass substrate, a transparent plastic substrate, a transparent metal oxide substrate, etc. Although not illustrated, at least one buffer layer may be provided on the substrate 10. For example, the buffer layer may include silicon oxide ($SiO_x$), silicon nitride ($SiN_x$), silicon oxynitride ($SiO_xN_y$), etc.

The gate electrode 15 may be provided on the substrate 10. The oxide semiconductor device illustrated in FIG. 1 may have a bottom gate configuration. However, the oxide semiconductor device may have various other configurations, for example, a top gate configuration, a dual gate configuration, etc.

The gate electrode 15 may include a metal, an alloy, a metal nitride, a conductive metal oxide, a transparent conductive material, etc. For example, the gate electrode 15 may include aluminum (Al), an alloy containing aluminum, aluminum nitride ($AlN_x$), silver (Ag), an alloy containing silver, tungsten (W), tungsten nitride ($WN_x$), copper (Cu), an alloy containing copper, nickel (Ni), chrome (Cr), molybdenum (Mo), an alloy containing molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide ($SrRu_xO_y$), zinc oxide ($ZnO_x$), indium tin oxide (ITO), tin oxide ($SnO_x$), gallium oxide ($GaO_x$), indium zinc Oxide (IZO), etc. These may be used alone or in a combination thereof.

The gate insulation layer 20 may be disposed on the substrate 10 to substantially cover the gate electrode 15. In an exemplary embodiment, the gate insulation layer 20 may sufficiently cover the gate electrode 15, and have a substantially level surface without a step around the gate electrode 15. The gate insulation layer 20 may include silicon compound, metal oxide, etc. For example, the gate insulation layer 20 may include silicon oxide, silicon nitride, silicon oxynitride, aluminum oxide, tantalum oxide, hafnium oxide, zirconium oxide, titanium oxide, etc. These may be used alone or in a combination thereof.

As illustrated in FIG. 1, the active layer 25 may be located on the gate insulation layer 20. The active layer 25 may include a semiconductor oxide, such as binary system compound ($AB_x$), ternary system compound ($AB_xC_y$) or quaternary system compound ($AB_xC_yD_z$), which may contain indium, zinc, gallium, tin, titanium, aluminum, hafnium (Hf), zirconium (Zr), magnesium (Mg), etc. For example, the active layer 25 may include indium-gallium-zinc oxide (IGZO), gallium zinc oxide ($GaZn_xO_y$), indium tin oxide (ITO), indium zinc oxide (IZO), zinc magnesium oxide ($ZnMg_xO_y$), zinc tin oxide ($ZnSn_xO_y$), zinc zirconium oxide ($ZnZR_xO_y$), zinc oxide ($ZnO_x$), gallium oxide ($GaO_x$), titanium oxide ($TiO_x$), tin oxide ($SnO_x$), indium oxide ($InO_x$), indium-gallium-hafnium oxide (IGHO), tin-aluminum-zinc oxide (TAZO), indium-gallium-tin oxide (IGSO), etc. These may be used alone or in a mixture thereof.

The insulating interlayer 30 may be provided on the gate insulation layer 20 to substantially cover the active layer 25. In an exemplary embodiment, the insulating interlayer 30 may sufficiently cover the active layer 25 while having a substantially flat upper face without a step around the active layer 25. The insulating interlayer 30 may include silicon compound. For example, the insulating interlayer 30 may include silicon oxide, silicon nitride, silicon oxynitride, etc. These may be used alone or in a combination thereof.

The protection structure 35 may be disposed on the insulating interlayer 30. The protection structure 35 may include the first metal oxide layer 40 disposed on the insulating interlayer 30, and the second metal oxide layer 45 disposed on the first metal oxide layer 40. In an exemplary embodiment, the first metal oxide layer 40 may include a metal oxide substantially the same as that contained in the second metal oxide layer 45. For example, each of the first and the second metal oxide layers 40 and 45 may include aluminum oxide, titanium oxide, tantalum oxide, zirconium oxide, etc. These may be used alone or in a combination thereof.

According to an exemplary embodiment, the first and the second metal oxide layers 40 and 45 may have different oxygen contents, respectively. The first metal oxide layer 40 may have a first composition of $MO_x1$ (wherein, M represents aluminum, titanium, tantalum or zirconium, O denotes oxygen, and x means a positive real number) that may contain a first metal oxide having a first oxygen content. Additionally, the second metal oxide layer 45 may have a second composition of $MO_x2$ that may contain a second metal oxide having second oxygen content. For example, in case that the first and the second metal oxide layers 40 an 45 include aluminum, the first metal oxide layer 40 may have the first composition of $AlO_x1$ containing aluminum oxide having the first oxygen content, and the second metal oxide layer 45 may have the second composition of $AlO_x2$ containing aluminum oxide having the second oxygen content.

In an exemplary embodiment, the first oxygen content of the first metal oxide layer 40 may be substantially greater than the second oxygen content of the second metal oxide layer 45. For example, a difference between the first oxygen content and the second oxygen content may be more than 3 atomic percentage (at %). In this case, the first metal oxide layer 40 may have a thickness between about 50 Å and about 1,000 Å, and the second metal oxide layer 45 may have a thickness of about 30 Å to about 300 Å. Accordingly, a thickness ratio between the first metal oxide layer 40 and the second metal oxide layer 45 may be in a range of about 1.0:0.03 to about 1.0:0.6.

In an exemplary embodiment, the second oxygen content of the second metal oxide layer 45 may be substantially greater than the first oxygen content of the first metal oxide layer 40. For example, the second oxygen content may be higher than the first oxygen content by more than 3 at %. Here, the thickness of the first metal oxide layer 40 may be in a range between about 30 Å and about 300 Å while the thickness of the second metal oxide layer 45 may be in a range between about 50 Å and about 1,000 Å.

Regarding the first and the second metal oxide layers 40 and 45 described above, the second oxygen content may be abruptly varied from the first oxygen content at an interface between the first metal oxide layer 40 and the second metal oxide layer 45. For example, the second oxygen content may be suddenly increased or decreased from the first oxygen content at an interface between the first metal oxide layer 40 and the second metal oxide layer 45.

According to an exemplary embodiment, the protection structure 35, including the first and the second metal oxide layers 40 and 45, may prevent the underlying structures from external moisture and/or hydrogen. If moisture and/or hydrogen permeate into the underlying structure of the oxide semiconductor device, the concentration of charge carriers in the active layer 25 may be undesirably increased and, thus, the threshold voltage (Vth) of the oxide semiconductor device may be negatively shifted, thereby degrading the electrical characteristics of the oxide semiconductor device. When the protection structure 35 blocks the permeation of moisture and/or hydrogen from an outside, the oxide semiconductor device may ensure improved electrical characteristics by preventing the threshold voltage shift thereof.

The source electrode 50 and the drain electrode 55 may be provided on the second metal oxide layer 45 of the protection structure 35. The source and the drain electrodes 50 and 55 may pass through the protection structure 35 and the insulating interlayer 30 so that the source and the drain electrodes 50 and 55 may make contact with a source region and a drain region of the active layer 25. In an exemplary embodiment, a source contact hole and drain contact hole may be provided through the protection structure 35 and the insulating interlayer 30. The source and the drain contact holes may expose the source and the drain regions of the active layer 25, respectively. When the source and the drain electrodes 50 and 55 fill the source and the drain holes, the source and the drain electrodes 50 and 55 may be electrically connected to the source and the drain regions, respectively. Each of the source and the drain regions 50 and 55 may include a metal, an alloy, a metal nitride, a conductive metal oxide, a transparent conductive material, etc. For example, each of the source and the drain electrodes 50 and 55 may include aluminum, copper, molybdenum, titanium, chrome, tantalum, tungsten, neodymium, scandium, alloys thereof, nitrides thereof, strontium ruthenium oxide, indium tin oxide, indium zinc oxide, zinc oxide, tin oxide, carbon nanotube, etc.

Figure 2:
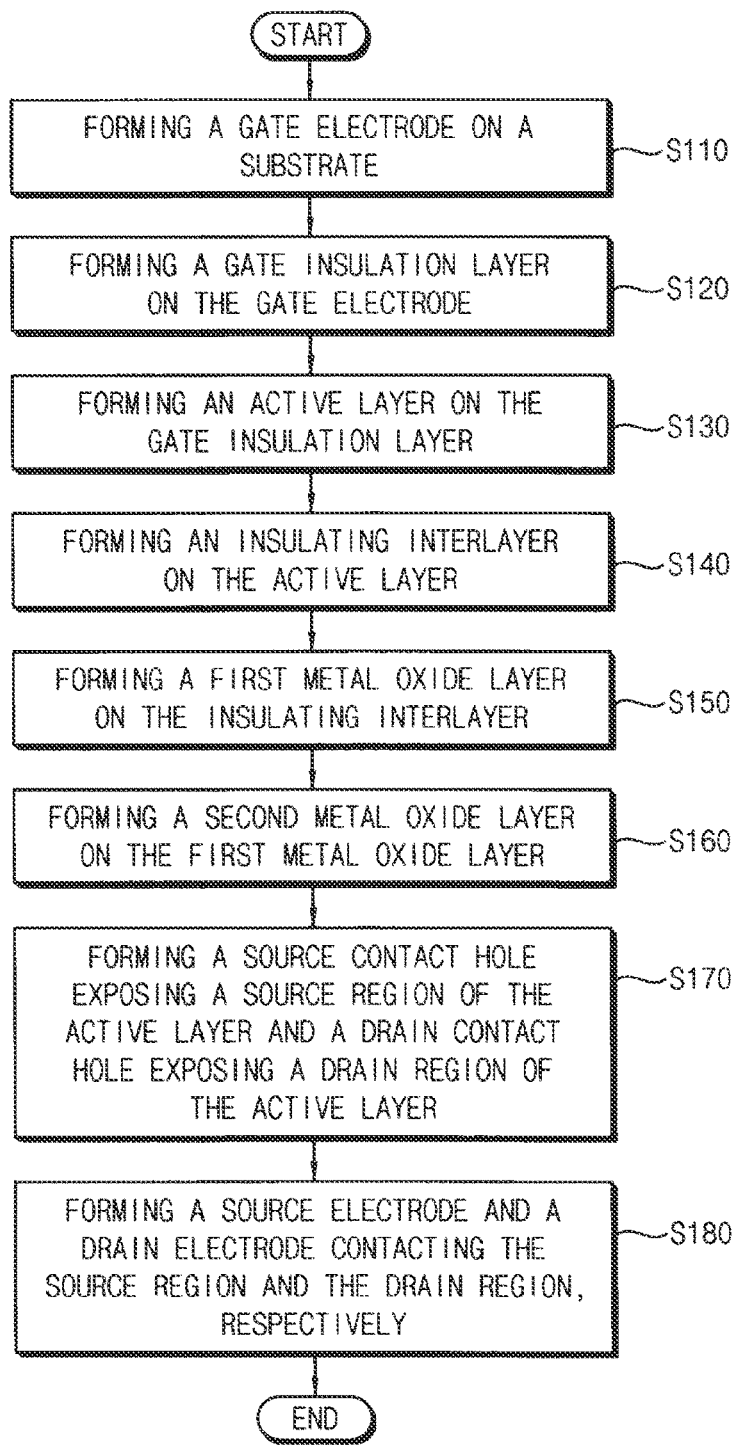
FIG. 2 is a flow chart illustrating a method of manufacturing an oxide semiconductor device in accordance with an exemplary embodiment.

FIG. 2 is a flow chart illustrating a method of manufacturing an oxide semiconductor device in accordance with an exemplary embodiment. FIGS. 3 to 6 are cross-sectional views illustrating a method of manufacturing an oxide semiconductor device in accordance with an exemplary embodiment.

Figure 3:
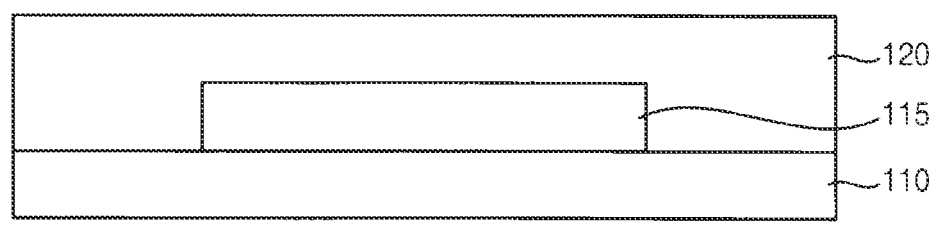
FIG. 3, FIG. 4, FIG. 5, and FIG. 6 are cross-sectional views illustrating a method of manufacturing an oxide semiconductor device in accordance with an exemplary embodiment.

Referring to FIGS. 2 and 3, in step S110, a gate electrode 115 may be formed on a substrate 110, which may be composed of transparent material, such as glass, transparent plastic, transparent ceramic, etc. The gate electrode 115 may be formed by a sputtering process, a spray process, a chemical vapor deposition (CVD) process, an atomic layer deposition (ALD) process, a vacuum evaporation process, a printing process, etc. The gate electrode 115 may be obtained using metal such as aluminum, tungsten, copper, nickel, chrome, molybdenum, titanium, platinum, tantalum or ruthenium, alloy containing these metals, nitrides of these metals, or conductive metal oxide.

A gate insulation layer 120 may be formed on the substrate 110 to cover the gate electrodes 115 in step S120. The gate insulation layer 120 may be formed by a CVD process, a thermal oxidation process, a plasma enhanced chemical vapor deposition (PECVD) process, a high density plasma-chemical vapor deposition (HDP-CVD) process, etc. The gate insulation layer 120 may be formed using silicon compound, metal oxide, etc. The gate insulation layer 120 may have a relatively large thickness that may sufficiently cover the gate electrode 115 on the substrate 110.

Figure 4:
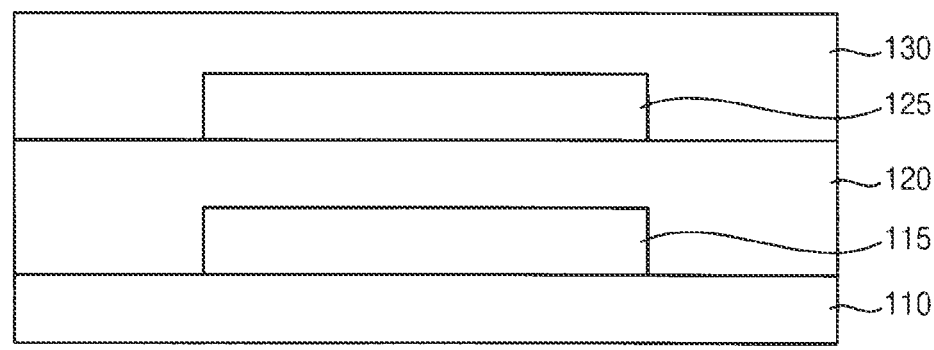

Referring to FIGS. 2 and 4, an active layer 125 may be formed on the gate insulation layer 120 in step S 130. The active layer 125 may be obtained by a sputtering process, a CVD process, a printing process, a vacuum evaporation process, an ALD process, a sol-gel process, a PECVD process, etc. The active layer 125 may be formed using a semiconductor oxide, such as a binary system compound, a ternary system compound, or a quaternary system compound. For example, the active layer 125 may be formed using a semiconductor oxide containing indium, gallium, tin, titanium, aluminum, hafnium, zirconium, magnesium, etc. The active layer 125 may be disposed on a portion of the gate insulation layer 120 under which the gate electrode 115 is disposed.

An insulating interlayer 130 may be formed on the gate insulation layer 120 to substantially cover the active layer 125 in step of S140. The insulating interlayer 130 may have a substantially flat upper face that sufficiently covers the active layer 125. In an exemplary embodiment, a planarization process may be performed on the insulating interlayer 130 such that the insulating interlayer 130 may have such a level surface.

Figure 5:
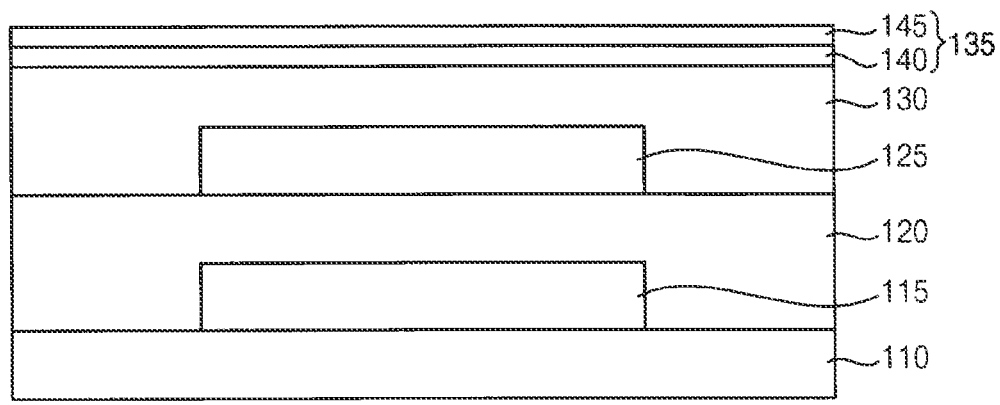

Referring to FIGS. 2 and 5, a first metal oxide layer 140 may be formed on the insulating interlayer 130 in step S150. The first metal oxide layer 140 may be formed by a sputtering process, a PECVD process, a CVD process, a vacuum evaporation process, etc. Additionally, the first metal oxide layer 140 may be formed using an aluminum oxide, a titanium oxide, a tantalum oxide, a zirconium oxide, etc.

In the formation of the first metal oxide layer 140 according to an exemplary embodiment, a gas mixture including an inactive gas (e.g., an argon (Ar) gas, a neon (Ne) gas, a nitrogen ($N_2$) gas, etc.) and an oxygen ($O_2$) gas may be introduced into a chamber having a substantial vacuum pressure, and then the gas mixture may be changed into a plasma containing oxygen to thereby provide an atmosphere containing oxygen in the chamber. When a sputtering process using a target containing aluminum, titanium, tantalum or zirconium is performed under the atmosphere containing oxygen, the first metal oxide layer 140 may be formed on the insulating interlayer 130.

In an exemplary embodiment, a metal layer (not illustrated) may be formed on the first metal oxide layer 140. The metal layer may be formed by a sputtering process using a target containing aluminum, titanium, tantalum or zirconium under an atmosphere containing no oxygen. An oxidation treatment may be performed on the metal layer so that a second metal oxide layer 145 may be formed on the first metal oxide layer 140 in step S160. As a result, a protection structure 135, which may include a plurality of metal oxide layers such as the first and the second metal oxide layers 140 and 145, may be provided on the insulating interlayer 135. The protection structure 135 may prevent moisture and/or hydrogen from permeating into the resultant structures, such that the protection structure 135 may enhance the electrical characteristics of the oxide semiconductor device by preventing the variation of threshold voltage (Vth) of the oxide semiconductor device. Moreover, the protection structure 135 of the metal oxide may have a relative large area when the protection structure 135 may include the plurality of metal oxide layers (e.g., 140 and 145) having different oxygen contents, respectively. For example, the first metal oxide layer 140 and/or the second metal oxide layer 145 may have a relatively large area when each of the first and the second metal oxide layers 140 and 145 includes aluminum oxide by the processes described above.

In an exemplary embodiment, the second metal oxide layer 145 may be obtained by forming the metal layer on the first metal oxide layer 140 under the atmosphere including no oxygen, and then by performing a thermal treatment on the metal layer under an atmosphere containing oxygen. For example, the second metal oxide layer 145 may be obtained by an annealing process performed at a temperature of about 200° C. to about 500° C.

According to an exemplary embodiment, the first metal oxide layer 140 may have a first oxygen content different from a second oxygen content of the second metal oxide layer 145. The first metal oxide layer 140 may have a first metal oxide composition of $MO_x1$ having the first oxygen content, and the second metal oxide layer 145 may have a metal oxide second composition of $MO_x2$ having the second oxygen content. The second oxygen content of the second metal oxide layer 145 may abruptly vary from the first oxygen content of the first metal oxide layer 140. In some Exemplary embodiments, the first oxygen content of the first metal oxide layer 140 may be greater than the second oxygen content of the second metal oxide layer 145 by more than about 3 at %. Here, the second oxygen content may abruptly decrease from the second oxygen content at an interface between the first metal oxide layer 140 and the second metal oxide layer 145. A difference between the first oxygen content and the second oxygen content in the protection structure 135 may be achieved by controlling process conditions such as temperatures and/or concentrations of oxygen in the process for forming the first metal oxide layer 140 and/or the thermal treatment for forming the second metal oxide layer 145. In other exemplary embodiments, the second oxygen content of the second metal oxide layer 145 may be greater than the first oxygen content of the first metal oxide layer 140 by more than about 3 at %. Here, the second oxygen content may abruptly increase from the second oxygen content at the interface between the first metal oxide layer 140 and the second metal oxide layer 145.

Figure 6:
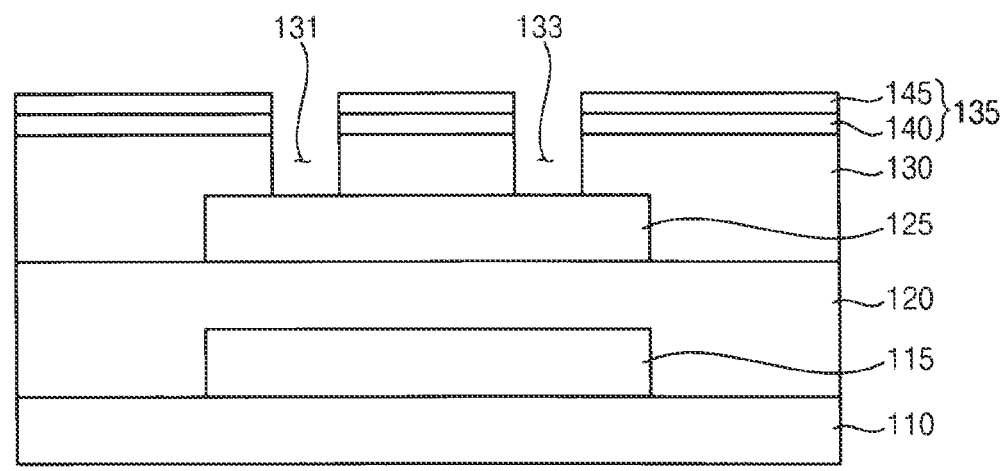

Referring to FIGS. 2 and 6, the second metal oxide layer 145, the first metal oxide layer 140, and the insulating interlayer 130 may be partially removed to form a source contact hole 131 and a drain contact hole 133 in step S170. The source contact hole 131 and the drain contact hole 133 may expose a source region and a drain region of the active layer 125, respectively.

In step S180, a source electrode (not illustrated) and a drain electrode (not illustrated) may be formed on the second metal oxide layer 145 while filling the source contact hole 131 and the drain contact hole 133, respectively. Accordingly, there is provided the oxide semiconductor device having a configuration substantially the same as that of the oxide semiconductor device described with reference to FIG. 1. The source and the drain electrodes may be formed by a CVD process, a vacuum evaporation process, a sputtering process, a PECVD process, an ALD process, etc. Further, each of the source and the drain electrodes may be formed using a metal, an alloy, a metal nitride, a conductive metal oxide, a transparent conductive material, etc.

Figure 7:
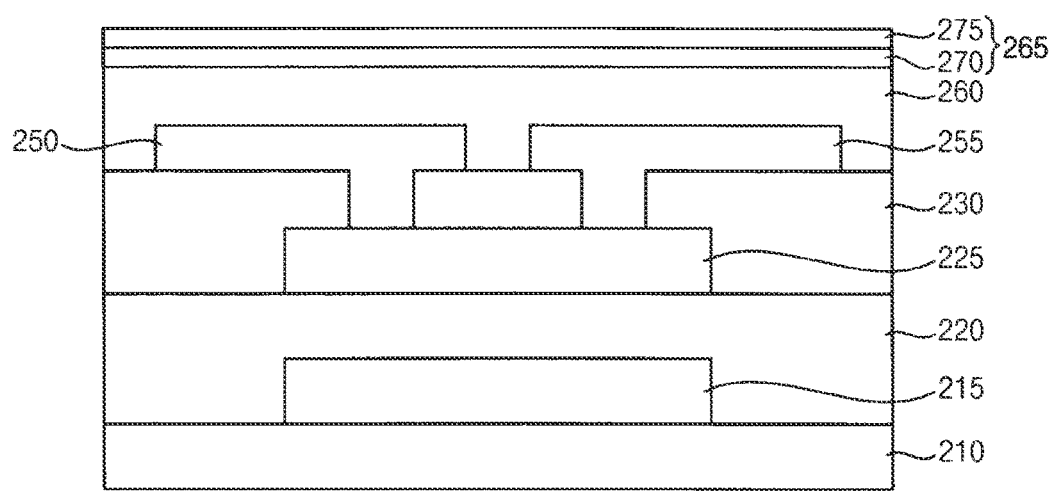
FIG. 7 is a cross-sectional view illustrating an oxide semiconductor device in accordance with an exemplary embodiment.

FIG. 7 is a cross-sectional view illustrating an oxide semiconductor device in accordance with another exemplary embodiment.

Referring to FIG. 7, the oxide semiconductor device may include a gate electrode 215, a gate insulation layer 220, an active layer 225, a first insulating interlayer 230, a source electrode 250, a drain electrode 255, a second insulating interlayer 260, a protection structure 265, etc. The protection structure 265 may include a plurality of metal oxide layers such as a first metal oxide layer 270 and a second metal oxide layer 275. For example, the first and the second metal oxide layers 270 and 275 may include an aluminum oxide, a titanium oxide, a tantalum oxide, a zirconium oxide, etc.

The gate electrode 215 may be provided on a substrate 210 including hard transparent material or soft transparent material. The gate electrode 215 may include a metal, an alloy, a metal nitride, a conductive metal oxide, a transparent conductive material, etc. The gate insulation layer 220 covering the gate electrode 215 may be disposed on the substrate 210. The gate insulation layer 220 may include a silicon compound, a metal oxide, etc. Further, the active layer 225 may be disposed on the gate insulation layer 220. The active layer 225 may include semiconductor oxide containing a binary system compound, a ternary system compound, a quaternary system compound, etc.

The first insulating interlayer 230 may locate on the gate insulation layer 220 while substantially covering the active layer 225. The first insulating interlayer 230 may include silicon compound. The source and the drain electrodes 250 and 255 may be disposed on the first insulating interlayer 230. The source electrode 250 and the drain electrode 255 may pass through a source contact hole and a drain contact hole formed through the insulating interlayer 230, and then may make contact with a source region and a drain region of the active layer 225. Each of the source and the drain regions 250 and 255 may include a metal, an alloy, a metal nitride, a conductive metal oxide, a transparent conductive material, etc. For example, the source and the drain electrodes 250 and 255 may include aluminum, copper, molybdenum, titanium, chrome, tantalum, tungsten, neodymium, scandium, alloys thereof, nitrides thereof, strontium ruthenium oxide, indium tin oxide, indium zinc oxide, zinc oxide, tin oxide, carbon nanotube, etc.

As illustrated in FIG. 7, the second insulating interlayer 260 may be disposed on the first insulating interlayer 230 to substantially cover the source electrode 250 and the drain electrode 255. The second insulating interlayer 260 may have a substantially flat upper face while sufficiently covering the source and the drain electrodes 250 and 255.

The protection structure 265 may be positioned the second insulating interlayer 260. The protection structure 265 may have the first and the second metal oxide layers 270 and 275 sequentially disposed on the second insulating interlayer 260. The first and the second metal oxide layers 270 and 275 may include the same metal oxide whereas the first metal oxide layer 270 may have an oxygen content different from that of the second metal oxide layer 275. For example, the first metal oxide layer 270 may have a first composition of $MO_x1$ (M indicates metal such as aluminum, titanium, tantalum or zirconium, O means oxygen and x represents a positive real number) containing a first oxygen content while the second metal oxide layer 275 may have a second composition of $MO_x2$ containing a second oxygen content. When the first and the second metal oxide layers 270 and 275 includes aluminum oxide, the first metal oxide layer 270 may have the first composition of $AlO_x1$ including the first oxygen content, and the second metal oxide layer 275 may have the second composition of $AlO_x2$ including the second oxygen content.

In an exemplary embodiment, the first oxygen content of the first metal oxide layer 270 may be greater than the second oxygen content of the second metal oxide layer 275. For example, an oxygen content difference between the first metal oxide layer 270 and the second metal oxide layer 275 may be more than about 3 at %. In this case, the first metal oxide layer 270 may have a thickness of about 50 Å to about 1,000 Å, and the second metal oxide layer 275 may have a thickness of about 30 Å to about 300 Å. Thus, a thickness ratio between the first and the second metal oxide layers 270 and 275 may be in a range between about 1.0:0.03 and about 1.0:0.6.

In another exemplary embodiment, the second oxygen content of the second metal oxide layer 275 may be greater than the first oxygen content of the first metal oxide layer 270. For example, the second oxygen content may be greater than the first oxygen content by more than about 3 at %. In this case, the first metal oxide layer 270 may have a thickness of about 30 Å to about 300 Å, and the second metal oxide layer 275 may have a thickness of about 50 Å to about 1,000 Å.

As described above, the first oxygen content of the first metal oxide layer 270 may be substantially greater or less than the second oxygen content of the second metal oxide layer 275. The variation from the first oxygen content to the second oxygen content may not be gradual but abrupt. For example, the second oxygen content may be abruptly changed from the first oxygen content at an interface between the first and the second metal oxide layers 270 and 275.

According to an exemplary embodiment, the protection structure 265 having the first and the second metal oxide layers 270 and 275 may effectively block the permeation of moisture and/or hydrogen from an outside, so that the variation of the threshold voltage (Vth) of the oxide semiconductor device may be substantially prevented. When the moisture or hydrogen passes through the oxide semiconductor device, the charge carrier density of the active layer 225 may increase such that the threshold voltage of the oxide semiconductor device may negatively shift, resulting in the deterioration of the electrical characteristics of the oxide semiconductor device. However, the protection structure 265 may prevent the moisture and/or hydrogen from being permeated into the oxide semiconductor device as described above, and thus, the electrical characteristics of the oxide semiconductor device may be enhanced.

Figure 8:
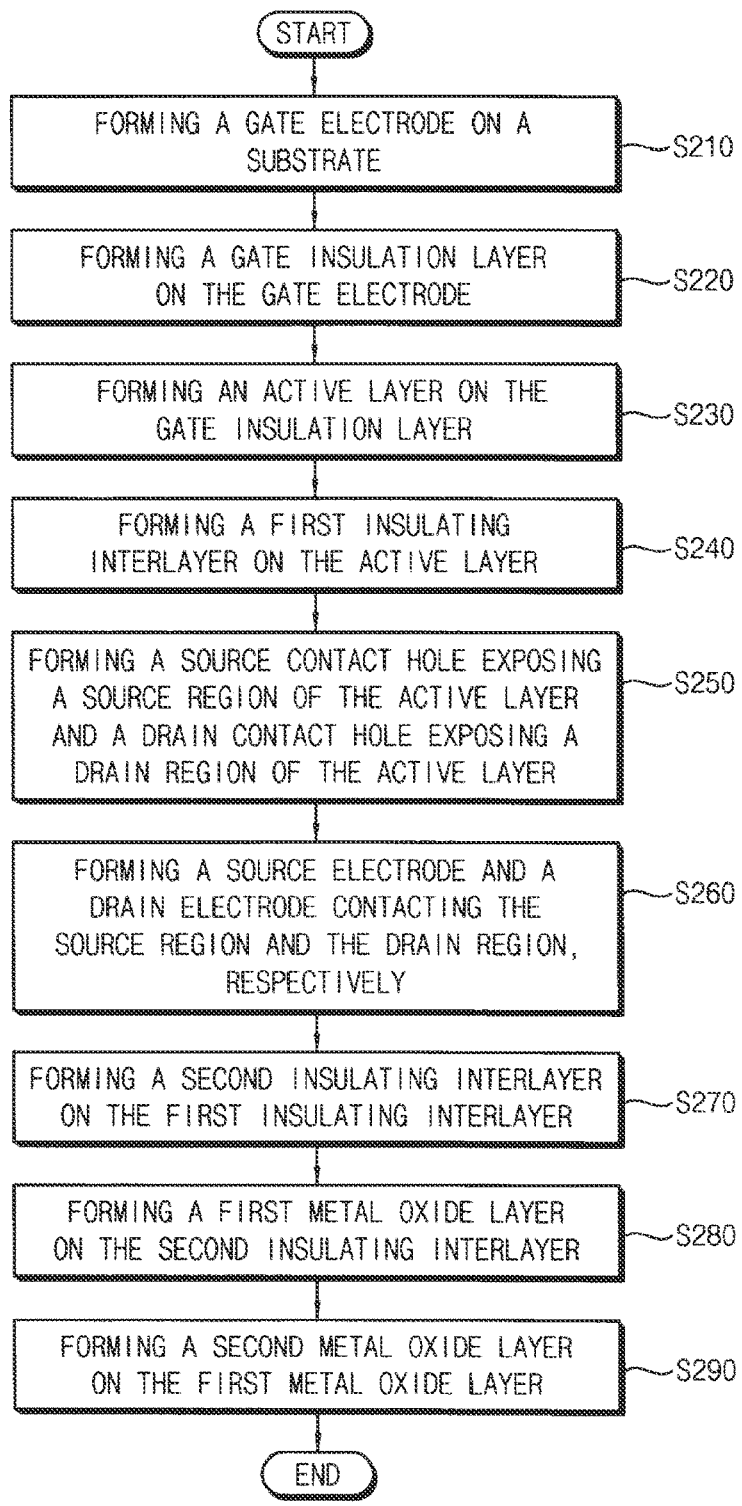
FIG. 8 is a flow chart illustrating a method of manufacturing an oxide semiconductor device in accordance with an exemplary embodiment.

FIG. 8 is a flow chart illustrating a method of manufacturing an oxide semiconductor device in accordance with an exemplary embodiment. FIGS. 9 to 12 are cross-sectional views illustrating a method of manufacturing an oxide semiconductor device in accordance with an exemplary embodiment.

Figure 9:
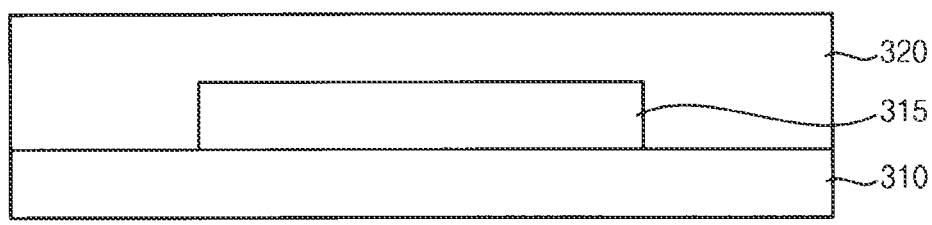
FIG. 9, FIG. 10, FIG. 11, and FIG. 12 are cross-sectional views illustrating a method of manufacturing an oxide semiconductor device in accordance with an exemplary embodiment.

Referring to FIGS. 8 and 9, a gate electrode 315 may be formed on a substrate 310 including insulation material in step S210. The gate electrode 315 may be formed by a sputtering process, a CVD process, an ALD process, a vacuum evaporation process or a printing process using a metal, an alloy, a metal nitride, a conductive metal oxide, etc.

In step S220, a gate insulation layer 320 may be formed on the substrate 310 to substantially cover the gate electrode 315. The gate insulation layer 320 may be formed by a CVD process, a thermal oxidation process, a PECVD process or an HDP-CVD process using a silicon compound, a metal oxide, etc.

Figure 10:
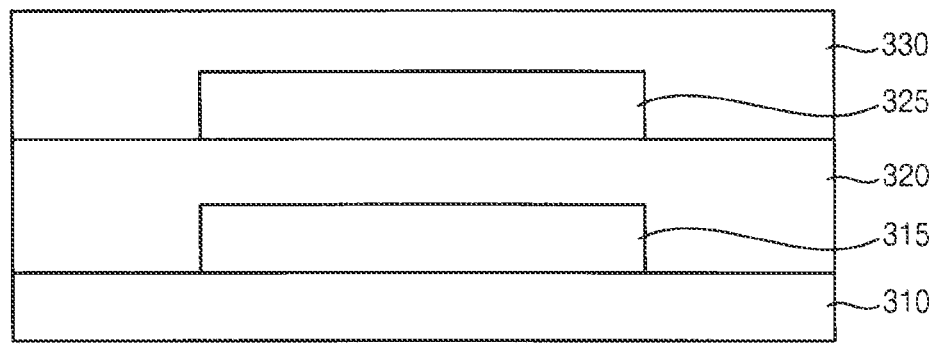

Referring to FIGS. 8 and 10, an active layer 325 may be formed on the gate insulation layer 320 in step S230. The active layer 325 may be obtained by a sputtering process, a CVD process, a printing process, a spray process, a sol-gel process, a vacuum evaporation process, an ALD process, a PECVD process, etc. Further, the active layer 325 may be formed using oxide semiconductor containing indium, zinc, gallium, tin, titanium, aluminum, hafnium, zirconium, magnesium, etc.

A first insulating interlayer 330 may be formed on the gate insulation layer 320 to substantially cover the active layer 325 in step S240. The first insulating interlayer 330 may sufficiently cover the active layer 325 and have a substantially level surface. The first insulating interlayer 330 may be formed using silicon compound by a CVD process, a PECVD process, an HDP-CVD process, etc.

Figure 11:
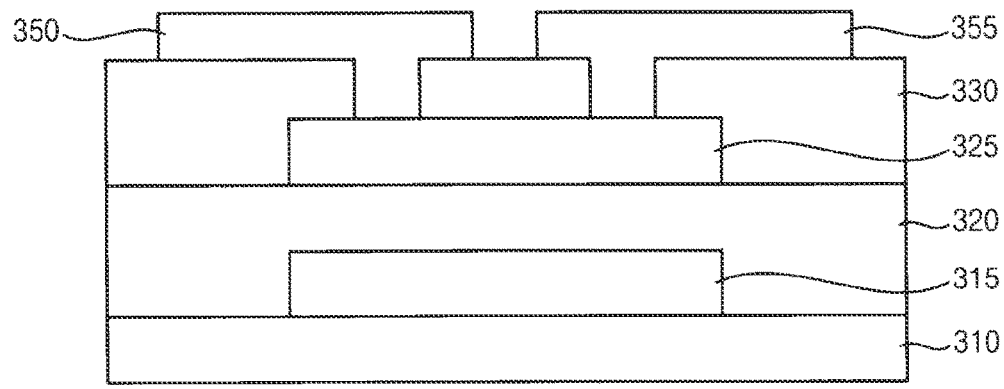

Referring to FIGS. 8 and 11, in step S250, the first insulating interlayer 330 may be partially etched to provide a source contact hole and a drain contact hole which may expose portions of the active layer 325. The source contact hole and the drain contact hole may expose a source region and a drain region of the active layer 325, respectively.

In step S260, a source electrode 350 and a drain electrode 355 may be formed on the active layer 325 and the first insulating interlayer 330. The source and the drain electrodes 350 and 355 may fill the source and the drain contact holes, respectively. Hence, the source and the drain electrodes 350 and 355 may make contact with the source and the drain regions of the active layer 325.

Figure 12:
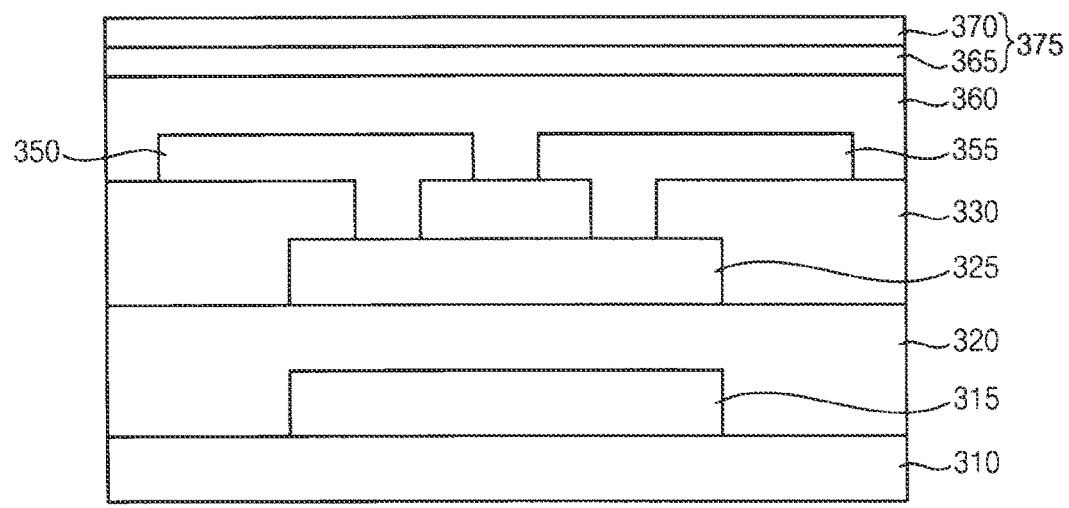

Referring to FIGS. 8 and 12, a second insulating interlayer 360 may be formed on the first insulating interlayer 330 in step S270. The second insulating interlayer 360 may sufficiently cover the source and the drain electrodes 350 and 355, and may have a substantially flat upper face. The second insulating interlayer 360 may be formed using a material substantially the same as that for the first insulating interlayer 330. Alternatively, the second insulating interlayer 360 may be formed using an organic material.

A protection structure 375 may be formed on the second insulating interlayer 360. According to some Exemplary embodiments, a first metal oxide layer 365 may be formed on the second insulating interlayer 360*n* in step S280. The first metal oxide layer 365 may be formed using aluminum oxide, titanium oxide, tantalum oxide or zirconium oxide by a sputtering process, a vacuum evaporation process, a CVD process, etc. In this case, the first metal oxide layer 365 may have a first composition of $MO_x1$ having a first oxygen content. Then, a second metal oxide layer 370 may be formed on the first metal oxide layer 365 in step S290.

In the formation of the second metal oxide layer 370, a metal layer (not illustrated) may be formed on the first metal oxide layer 365, and then the metal oxide layer may be oxidized to obtain the second metal oxide layer 370. The metal layer may be formed using aluminum, titanium, tantalum, zirconium, etc. Additionally, an oxidation treatment for the metal layer may include a thermal oxidation process such as an annealing process performed under an atmosphere containing oxygen. Here, the second metal oxide layer 370 may have a second composition of $MO_x2$ having a second oxygen content which may be less than or greater than the first oxygen content.

The protection structure 375 may prevent the permeation of the moisture and/or hydrogen from an outside, so the oxide semiconductor device may ensure improved electrical characteristics by blocking the variation of the threshold voltage thereof. Further, the metal oxide layers 365 and 360 of the protection structure 375 may be formed to have relatively large areas by the above described processes.

According to exemplary embodiments, when the oxide semiconductor device including the above-described protection structure is applied to a display device such as an organic light emitting display device or a liquid crystal display device, the display device may also ensure improved quality of image displayed thereon, am enhanced response speed, etc.

According to the oxide semiconductor device of the exemplary embodiments, the protection structure including the plurality of metal oxide layers may effectively block the permeation of moisture and/or hydrogen from an outside, so that the electrical characteristics of the oxide semiconductor device may not be substantially deteriorated by the moisture and/or hydrogen. Further, when a display device includes the oxide semiconductor device including the protection structure, the display device may also have improved image quality, enhanced response speed, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A semiconductor device comprising:
   a gate electrode disposed on a substrate;
   a gate insulation layer disposed on the substrate to cover the gate electrode;
   an active layer disposed on the gate insulation layer, the active layer comprising an oxide semiconductor;
   an insulating interlayer disposed on the gate insulation layer and configured to cover the active layer;
   a protection structure disposed on the insulating interlayer; and
   a source electrode and a drain electrode disposed on the protection structure, the source electrode and the drain electrode contacting a source region and a drain region of the active layer, respectively,
   wherein:
   the protection structure comprises a first metal oxide layer disposed on the insulating interlayer, and a second metal oxide layer disposed on the first metal oxide layer;
   the first metal oxide layer has a first oxygen content greater than a second oxygen content of the second metal oxide layer;
   the second oxygen content abruptly varies from the first oxygen content at an interface between the first metal oxide layer and the second metal oxide layer;
   the first metal oxide layer has a first composition of $MO_{x1}$ (where M represents aluminum, titanium, tantalum or zirconium, O denotes oxygen, and x means a positive real number) having a first oxygen content, and the second metal oxide layer has a second composition of $MO_{x2}$ having a second oxygen content; and
   a thickness ratio between the first metal oxide layer and the second metal oxide layer is in a range of about 1.0:0.03 to 1.0:0.6.

2. The semiconductor device of claim 1, wherein each of the first metal oxide layer and the second metal oxide layer comprises at least one of an aluminum oxide, a titanium oxide, a tantalum oxide, or a zirconium oxide.

3. The semiconductor device of claim 1, wherein a difference between the first oxygen content and the second oxygen content is greater than about 3 atomic percentage.

4. The semiconductor device of claim 1, wherein the first oxygen content is greater than the second oxygen content.

5. The semiconductor device of claim 1, wherein the first oxygen content is less than the second oxygen content.

6. A method of manufacturing a semiconductor device, comprising:
   forming a gate electrode on a substrate;
   forming a gate insulation layer on the substrate to cover the gate electrode;
   forming an active layer comprising an oxide semiconductor on the gate insulation layer;
   forming an insulating interlayer on the active layer to cover the gate insulation layer;
   forming a protection structure on the insulating interlayer; and
   forming a source electrode and a drain electrode on the protection structure, the source electrode and the drain electrode contacting a source region and a drain region of the active layer, respectively,
   wherein:
   forming the protection structure comprises:
      forming a first metal oxide layer on the insulating interlayer; and
      forming a second metal oxide layer on the first metal oxide layer;
   the first metal oxide layer has a first oxygen content greater than a second oxygen content of the second metal oxide layer;
   the second oxygen content abruptly varies from the first oxygen content at an interface between the first metal oxide layer and the second metal oxide layer;
   the first metal oxide layer has a first composition of $MO_{x1}$ (where M represents aluminum, titanium, tantalum or zirconium, O denotes oxygen, and x means a positive real number) having a first oxygen content, and the second metal oxide layer has a second composition of $MO_{x2}$ having a second oxygen content; and
   a thickness ratio between the first metal oxide layer and the second metal oxide layer is in a range of about 1.0:0.03 to 1.0:0.6.

7. The method of claim 6, wherein forming the second metal oxide layer comprises:
   forming a metal layer on the first metal oxide layer; and
   performing an oxidation treatment on the metal layer.

8. The method of claim 7, wherein forming the metal layer comprises a sputtering process.

9. The method of claim 7, wherein the oxidation treatment comprises a thermal oxidation process.

* * * * *